United States Patent
Maeta et al.

(10) Patent No.: US 11,549,019 B2
(45) Date of Patent: Jan. 10, 2023

(54) INORGANIC OXIDE SOL DISPERSED IN HYDROCARBON AND PRODUCTION METHOD THEREFOR

(71) Applicant: NISSAN CHEMICAL CORPORATION, Tokyo (JP)

(72) Inventors: Tomoya Maeta, Sodegaura (JP); Naohiko Suemura, Sodegaura (JP); Keiko Yoshitake, Sodegaura (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 17/639,978

(22) PCT Filed: Jul. 6, 2021

(86) PCT No.: PCT/JP2021/025482
§ 371 (c)(1),
(2) Date: Mar. 3, 2022

(87) PCT Pub. No.: WO2022/009889
PCT Pub. Date: Jan. 13, 2022

(65) Prior Publication Data
US 2022/0332589 A1   Oct. 20, 2022

(30) Foreign Application Priority Data
Jul. 7, 2020 (JP) .............................. JP2020-117406

(51) Int. Cl.
| | | |
|---|---|---|
| C09C 3/12 | (2006.01) | |
| C01B 33/145 | (2006.01) | |
| C01G 25/02 | (2006.01) | |
| C09C 1/30 | (2006.01) | |
| G03F 7/004 | (2006.01) | |

(52) U.S. Cl.
CPC .............. C09C 3/12 (2013.01); C01B 33/145 (2013.01); C01G 25/02 (2013.01); C09C 1/3081 (2013.01); C01P 2004/62 (2013.01); C01P 2004/64 (2013.01); C01P 2004/82 (2013.01); G03F 7/0043 (2013.01)

(58) Field of Classification Search
CPC ..... C01B 33/145; C01B 33/113; C01G 25/02; C01G 23/04; C09C 3/12; C09C 1/3081
See application file for complete search history.

(56) References Cited

U.S. PATENT DOCUMENTS

| | | | |
|---|---|---|---|
| 5,651,921 A | | 7/1997 | Kaijou |
| 2012/0316266 A1 | | 12/2012 | Koyama et al. |
| 2022/0033268 A1 | | 2/2022 | Suemura et al. |

FOREIGN PATENT DOCUMENTS

| | | | | |
|---|---|---|---|---|
| CN | 102781821 A | | 11/2012 | |
| CN | 105612165 A | * | 5/2016 | ............ C07F 7/1836 |
| CN | 109311750 B | * | 8/2021 | ......... C04B 20/1066 |
| EP | 175132 A1 | | 3/1992 | |
| JP | S58-145614 A | | 8/1983 | |
| JP | H04-108606 A | | 4/1992 | |
| JP | 2005-200294 A | | 7/2005 | |
| JP | 2005-314197 A | | 11/2005 | |
| JP | 2013-103856 A | | 5/2013 | |
| JP | 2020176037 A | * | 10/2020 | |
| WO | 2020/175159 A1 | | 9/2020 | |
| WO | WO-2020175159 A1 | * | 9/2020 | .............. B01J 13/00 |

OTHER PUBLICATIONS

Sep. 7, 2021 Written Opinion of the International Searching Authority issued in International Patent Application No. PCT/JP2021/025482.
Aug. 22, 2022 Office Action issued in Chinese Patent Application No. 202180005178.3.

* cited by examiner

Primary Examiner — Amanda C. Walke
(74) Attorney, Agent, or Firm — Oliff PLC

(57) ABSTRACT

A sol of inorganic oxide particles is stably dispersed in a hydrophilic organic solvent containing a hydrocarbon such as a paraffinic hydrocarbon or a naphthenic hydrocarbon. The sol contains a dispersion medium containing an organic solvent containing a $C_{6-18}$ paraffinic hydrocarbon, a $C_{6-18}$ naphthenic hydrocarbon, or a mixture of these, a $C_{4-8}$ alcohol having a carbon chain with a carbon-carbon bond in the molecule in an amount of 0.1 to 5% by mass in the entire dispersion medium, and inorganic oxide particles having an average particle diameter of 5 to 200 nm as measured by dynamic light scattering as a dispersoid, wherein the inorganic oxide particles contain a $C_{1-3}$ alkyl group bonded to a silicon atom and a $C_{4-18}$ alkyl group. The paraffinic hydrocarbon is a normal paraffinic hydrocarbon or an isoparaffinic hydrocarbon. The naphthenic hydrocarbon is a saturated aliphatic cyclic hydrocarbon substitutable with a $C_{1-10}$ alkyl group.

14 Claims, No Drawings

INORGANIC OXIDE SOL DISPERSED IN HYDROCARBON AND PRODUCTION METHOD THEREFOR

TECHNICAL FIELD

The present invention relates to an inorganic oxide sol in which inorganic oxide particles whose surfaces are modified with an alkyl group are dispersed in a hydrocarbon solvent, and a method for producing the inorganic oxide sol.

BACKGROUND ART

An inorganic oxide sol dispersed in an organic solvent is useful when the sol is dispersed in a resin composition (e.g., plastic or varnish composition).

For example, there has been disclosed a method for preparing a silica sol dispersed in a non-polar organic solvent, in which the pH of a silica sol dispersed in an aqueous solvent is adjusted to 1 to 5, and then a non-polar organic solvent and a surfactant are added to the dispersed silica sol to form an emulsion, followed by azeotropic dehydration; and a method for preparing a silica sol dispersed in a non-polar organic solvent, in which a non-polar organic solvent is added to a silica sol dispersed in an alcohol, to thereby perform solvent replacement (see Patent Document 1). The non-polar organic solvent used in the disclosed method is a hydrocarbon such as benzene, toluene, heptane, or octane, a petroleum solvent such as kerosene, or a petrochemical solvent. As disclosed in the aforementioned method, a hydrophobic silica sol is prepared by coating the surfaces of silica particles with an alkyl-substituted silane such as octadecylmethyldimethoxysilane.

There has also been disclosed a process in which an aqueous silica sol is converted into an isopropyl alcohol silica sol through solvent replacement; the solvent is replaced by an alcohol of high boiling point; a silylation agent (e.g., trimethylchlorosilane) is added to the silica sol to thereby prepare a trimethylsilylated silica sol; and the solvent is removed to yield powdery silica (see Patent Document 2).

There has also been disclosed a method for producing an organic solvent silica sol, in which the surfaces of silica particles dispersed in a hydrophilic solvent (silica sol) are treated with an alkylalkoxide silane in the presence of a primary alcohol such as butyl alcohol, and the hydrophilic solvent is replaced by a solvent such as a ketone, an ester, an ether, or a hydrocarbon (see Patent Document 3).

PRIOR ART DOCUMENTS

Patent Documents

Patent Document 1: JP 1992-108606 A
Patent Document 2: JP 1983-145614 A
Patent Document 3: JP 2005-200294 A

SUMMARY OF THE INVENTION

Problems to be Solved by the Invention

The present invention provides a sol of inorganic oxide particles stably dispersed in a hydrophilic organic solvent containing a hydrocarbon such as a paraffinic hydrocarbon or a naphthenic hydrocarbon.

Means for Solving the Problems

A first aspect of the present invention is a sol comprising inorganic oxide particles as a dispersoid; and a dispersion medium containing an organic solvent containing a $C_{6-18}$ paraffinic hydrocarbon, a $C_{6-18}$ naphthenic hydrocarbon, or a mixture of these, and a $C_{4-8}$ alcohol having a carbon-carbon bond in the molecule, wherein:

the alcohol is contained in an amount of 0.1 to 5% by mass in the entire dispersion medium, the inorganic oxide particles have an average particle diameter of 5 to 200 nm as measured by dynamic light scattering, and the inorganic oxide particles contain a silicon atom bonded to a $C_{1-3}$ alkyl group and a silicon atom bonded to a $C_{4-18}$ alkyl group.

A second aspect of the present invention is the sol according to the first aspect, wherein the inorganic oxide particles contain a silane compound in which a $C_{4-18}$ alkyl group is bonded to a silicon atom and a silane compound in which a $C_{1-3}$ alkyl group is bonded to a silicon atom in proportions by mole of 1:0.1 to 30 in terms of silicon atom.

A third aspect of the present invention is the sol according to the first or second aspect, wherein the paraffinic hydrocarbon is a normal paraffinic hydrocarbon or an isoparaffinic hydrocarbon.

A fourth aspect of the present invention is the sol according to any one of the first to third aspects, wherein the naphthenic hydrocarbon is a saturated aliphatic cyclic hydrocarbon substitutable with a $C_{1-10}$ alkyl group.

A fifth aspect of the present invention is the sol according to any one of the first to fourth aspects, wherein the alcohol is n-butanol, n-pentanol, or n-hexanol.

A sixth aspect of the present invention is the sol according to any one of the first to fifth aspects, wherein the inorganic oxide particles are particles of an oxide of at least one metal selected from the group consisting of Si, Ti, Fe, Cu, Zn, Y, Zr, Nb, Mo, In, Sn, Sb, Ta, W, Pb, Bi, and Ce.

A seventh aspect of the present invention is the sol according to the sixth aspect, wherein the inorganic oxide particles are silica particles, zirconia particles, or titania particles.

An eighth aspect of the present invention is the sol according to the sixth aspect, wherein the inorganic oxide particles are metal oxide particles having a core-shell structure in which the surface of a core particle formed of at least one metal oxide selected from the group consisting of tin oxide, zirconium oxide, and titanium oxide is coated with at least one selected from among silica, tin oxide, antimony oxide, and tungsten oxide.

A ninth aspect of the present invention is the sol according to any one of the first to eighth aspects, wherein the inorganic oxide particles are coated with a silane compound of the following Formula (1):

$$R^1_a Si(R^2)_{4-a} \quad \text{Formula (1)}$$

(wherein $R^1$ is an alkyl group, a halogenated alkyl group, an alkenyl group, or an organic group having an epoxy group, a (meth)acryloyl group, a mercapto group, an amino group, a ureido group, or a cyano group, and is bonded to a silicon atom via an Si—C bond; at least one $R^1$ is a $C_{4-18}$ alkyl group and is bonded to a silicon atom via an Si—C bond; $R^2$ is an alkoxy group, an acyloxy group, or a halogen group; and a is an integer of 1 to 3).

A tenth aspect of the present invention is the sol according to the ninth aspect, wherein the inorganic oxide particles are coated with at least one silane compound selected from the group consisting of silane compounds of Formula (1) and the following Formulae (2) and (3):

$$[R^3_b Si(R^4)_{3-b}]_2 Y_c \quad \text{Formula (2)}$$

$$R^5_d Si(R^6)_{4-d} \quad \text{Formula (3)}$$

(wherein $R^3$ and $R^5$ are each a $C_{1-3}$ alkyl group and bonded to a silicon atom via an Si—C bond; $R^4$ and $R^6$ are each an alkoxy group, an acyloxy group, or a halogen group; Y is an alkylene group, an NH group, or an oxygen atom; at least one $R^3$ and at least one $R^5$ are a $C_{1-3}$ alkyl group and bonded to a silicon atom via an Si—C bond; b is an integer of 1 to 3; c is an integer of 0 or 1; and d is an integer of 1 to 3).

An eleventh aspect of the present invention is the sol according to any one of the first to tenth aspects, wherein, when the concentration of the inorganic oxide particles is 50% by mass or less, the viscosity at 20° C. of the sol is 1.0 to 10.0 times the viscosity at 20° C. of the organic solvent containing a $C_{6-18}$ paraffinic hydrocarbon, a $C_{6-18}$ naphthenic hydrocarbon, or a mixture of these, which serves as a dispersion medium.

A twelfth aspect of the present invention is the sol according to the eleventh aspect, wherein, when the concentration of the inorganic oxide particles is 5 to 50% by mass, the viscosity at 20° C. of the sol is 1.0 to 10.0 times the viscosity at 20° C. of the organic solvent containing a $C_{6-18}$ paraffinic hydrocarbon, a $C_{6-18}$ naphthenic hydrocarbon, or a mixture of these, which serves as a dispersion medium.

A thirteenth aspect of the present invention is a production method for the sol according to any one of the ninth to twelfth aspects, the method comprising the following steps (A) to (D):

step (A): a step of preparing a sol containing a $C_{4-8}$ alcohol having a carbon-carbon bond in the molecule in an amount of 15% by mass or more in the entire dispersion medium, from a sol containing, as a dispersoid, inorganic oxide particles having an average particle diameter of 5 to 200 nm as measured by dynamic light scattering, and an aqueous solvent or a $C_{1-3}$ alcohol as a dispersion medium;

step (B): a step of adding a silane compound of Formula (1) to the sol prepared in the step (A), and allowing reaction to proceed at a temperature of 20° C. to the boiling point of the dispersion medium for 0.1 to 6 hours.

step (C): a step of adding a $C_{6-18}$ paraffinic hydrocarbon, a $C_{6-18}$ naphthenic hydrocarbon, or a mixture of these to the sol prepared in the step (B), and removing water and/or the alcohol to the outside of the system; and step (D): a step of adding at least one silane compound selected from the group consisting of silane compounds of Formulae (2) and (3) to the sol prepared in the step (C) if necessary, and allowing reaction to proceed at a temperature of 20° C. to the boiling point of the dispersion medium for 0.1 to 6 hours.

A fourteenth aspect of the present invention is the production method according to the thirteenth aspect, wherein the method further comprises the following step (E) after the step (D):

step (E): a step of adding a $C_{8-18}$ paraffinic hydrocarbon, a $C_{8-18}$ naphthenic hydrocarbon, or a mixture of these, and removing the alcohol.

Effects of the Invention

In the present invention, inorganic oxide particles having high hydrophobic functional group density are prepared through silylation with short-chain alkyl groups (e.g., $C_{1-3}$ alkyl groups) at intervals between long-chain alkyl groups (e.g., $C_{4-18}$ alkyl groups). This can achieve such an effect that the inorganic oxide sol, which is stably dispersed in a hydrocarbon organic solvent containing a paraffinic hydrocarbon and a naphthenic hydrocarbon, can be prepared.

The proportions by mole of a silane compound in which a $C_{4-18}$ alkyl group is bonded to a silicon atom and a silane compound in which a $C_{1-3}$ alkyl group is bonded to a silicon atom may be 1:0.1 to 30 in terms of silicon atom. This case can achieve such an effect that the resultant inorganic oxide sol is more stably dispersed in a hydrocarbon organic solvent.

The inorganic oxide particles may be particles of an oxide of at least one metal selected from the group consisting of Si, Ti, Fe, Cu, Zn, Y, Zr, Nb, Mo, In, Sn, Sb, Ta, W, Pb, Bi, and Ce, or metal oxide particles having a core-shell structure in which the surface of a core particle formed of at least one metal oxide selected from the group consisting of tin oxide, zirconium oxide, and titanium oxide is coated with at least one metal oxide selected from among silica, tin oxide, antimony oxide, and tungsten oxide. This case can achieve such an effect that the resultant inorganic oxide sol is stably dispersed in a hydrocarbon organic solvent.

The inorganic oxide particles may be coated with at least one silane compound selected from the group consisting of silane compounds of Formulae (1), (2), and (3). This case can achieve such an effect that the resultant inorganic oxide sol is stably dispersed in a hydrocarbon organic solvent.

In order to produce an inorganic oxide sol stably dispersed in a hydrocarbon organic solvent, a hydrophilic organic solvent must be gradually replaced by a hydrocarbon organic solvent. The production method of the present invention, which involves the use of a $C_{4-6}$ alcohol and includes the aforementioned steps (A) to (D) and (E), can remove the alcohol to the outside of the system in the step wherein a hydrophilic organic solvent is completely replaced by a hydrocarbon organic solvent, and can achieve such an effect that the resultant inorganic oxide sol is stably dispersed in a hydrocarbon organic solvent.

MODES FOR CARRYING OUT THE INVENTION

In order to produce a silica sol dispersed in a highly hydrophobic hydrocarbon organic solvent (e.g., a paraffinic hydrocarbon or a naphthenic hydrocarbon) from an inorganic oxide sol (e.g., silica sol) dispersed in an aqueous medium or a hydrophilic organic solvent, the surfaces of inorganic oxide particles must be hydrophobized with a reactive silane. Although silanol is present on the surfaces of inorganic oxide particles formed of silica, the particle surfaces have a limited area, and only a limited amount of silanol is present on the particle surfaces. Thus, a reactive silane must be selected and used for increasing the density of the hydrophobic group of the inorganic oxide particle surfaces, in order to efficiently hydrophobize the particle surfaces with the reactive silane. In the case of a silane compound, long-chain alkyl groups bonded to silicon atoms extend outward from the particle surface, and the alkyl groups, which are bulky functional groups, are present on the particle surface at intervals. The particle surface is not sufficiently hydrophobized at the interval portions because of the presence of the silanol of the particle itself, i.e., the particle surface has a hydrophilic portion. In the present invention, the particle surface is silylated with short-chain alkyl groups at intervals between highly bulky long-chain alkyl groups, to thereby prepare inorganic oxide particles having high hydrophobic functional group density. Thus, the resultant inorganic oxide sol can be stably dispersed in a hydrocarbon organic solvent.

As described above, the surfaces of inorganic oxide particles are hydrophobized with a long-chain alkyl group or a silylation agent for solvent replacement of a hydrophilic organic solvent with a hydrocarbon organic solvent. In this case, the solvent replacement must be performed in a stepwise manner. When a substance exhibiting, for example, the effect of compatibilizing a hydrophilic organic solvent and a hydrocarbon organic solvent is used, the solvent replacement can be performed without causing a change in particle diameter due to aggregation or gelation (e.g., thickening). The substance exhibiting such a compatibilizing effect is preferably a substance having intermediate properties between a hydrophilic organic solvent and a hydrocarbon organic solvent; specifically, a substance that is compatible with both a hydrophilic organic solvent and a hydrocarbon organic solvent and allows gradually hydrophobized inorganic oxide particles to be well compatible with both a hydrophilic organic solvent and a hydrocarbon organic solvent. Such a substance is preferably, for example, a $C_{4-6}$ alcohol. Such a substance can be removed to the outside of the system in the step wherein a hydrophilic organic solvent is completely replaced by a hydrocarbon organic solvent.

The present invention is directed to a sol that contains a dispersion medium containing an organic solvent containing a $C_{6-18}$ paraffinic hydrocarbon, a $C_{6-18}$ naphthenic hydrocarbon, or a mixture of these, a $C_{4-8}$ alcohol having a carbon chain with a carbon-carbon bond in the molecule in an amount of 0.1 to 5% by mass in the entire dispersion medium, and inorganic oxide particles having an average particle diameter of 5 to 200 nm as measured by dynamic light scattering as a dispersoid, wherein the inorganic oxide particles contain a $C_{1-3}$ alkyl group bonded to a silicon atom and a $C_{4-18}$ alkyl group.

The usable $C_{4-6}$ alcohol is, for example, an alcohol described below, such as n-butanol, n-pentanol, or n-hexanol. The $C_{4-18}$ alkyl group is derived from a silane compound of Formula (1), and the $C_{1-3}$ alkyl group is derived from a silane compound of Formula (2) or (3). Such an alkyl group is provided through reaction of the corresponding silane compound with a silanol group on the surfaces of the inorganic oxide particles (e.g., silica particles) and modification of the silica particle surfaces with the silane compound.

The sol of the present invention has a solid content of 0.1 to 60% by mass, or 1 to 55% by mass, or 10 to 55% by mass. The term "solid content" as used herein refers to all components (except for the solvent component) contained in the sol.

In the sol of the present invention, the inorganic oxide particles have an average particle diameter of 5 to 200 nm or 5 to 150 nm as measured by dynamic light scattering (DLS), and the inorganic oxide particles have an average primary particle diameter of 5 to 200 nm, or 5 to 150 nm, or 5 to 100 nm as measured by observation with a transmission electron microscope.

When the concentration of the inorganic oxide particles is 20 to 50% by mass in the sol produced in the present invention, the viscosity at 20° C. of the sol is 1.0 to 10.0 times, or 1.1 to 10.0 times, or 1.2 to 10.0 times, or 1.2 to 8.0 times, or 1.3 to 8.0 times the viscosity at 20° C. of the hydrocarbon-containing organic solvent containing a $C_{6-18}$ paraffinic hydrocarbon, a $C_{6-18}$ naphthenic hydrocarbon, or a mixture of these, which serves as a dispersion medium.

When the concentration of the inorganic oxide particles is 5 to 50% by mass, or 10 to 50% by mass, or 20 to 50% by mass, the viscosity at 20° C. of the sol is 1.0 to 10.0 times the viscosity at 20° C. of the hydrocarbon-containing organic solvent containing a $C_{6-18}$ paraffinic hydrocarbon, a $C_{6-18}$ naphthenic hydrocarbon, or a mixture of these, which serves as a dispersion medium.

The aforementioned viscosity can be measured with an Ostwald viscometer or a B-type rotational viscometer.

Specifically, a viscosity of 10 mPa·s or less can be measured with an Ostwald viscometer, and a viscosity of more than 10 mPa·s can be measured with a B-type rotational viscometer.

The aforementioned solvent replacement refers to the case where the dispersion medium of the sol containing an aqueous solvent or a $C_{1-3}$ alcohol and a $C_{4-6}$ alcohol is replaced by a dispersion medium containing, as a main component, a hydrocarbon-containing organic solvent containing a $C_{6-18}$ paraffinic hydrocarbon, a $C_{6-18}$ naphthenic hydrocarbon, or a mixture of these.

The inorganic oxide sol used as a raw material in the present invention may be a sol in which inorganic oxide particles are dispersed in an aqueous medium or a $C_{1-3}$ alcohol serving as a dispersion medium. The aforementioned inorganic oxide particles are, for example, particles of an oxide of at least one metal selected from the group consisting of Si, Ti, Fe, Cu, Zn, Y, Zr, Nb, Mo, In, Sn, Sb, Ta, W, Pb, Bi, and Ce. Examples of the metal oxide include $TiO_2$, $Fe_2O_3$, CuO, ZnO, $Y_2O_3$, $ZrO_2$, $Nb_2O_5$, $NbO_2$, $Nb_2O_3$, $MoO_2$, $MoO_3$, $In_2O_3$, $SnO_2$, $Sb_2O_3$, $Sb_2O_5$, $Ta_2O_5$, $W_2O_3$, $WO_2$, $WO_3$, PbO, $Pb_2O_4$, $PbO_2$, $Bi_2O_3$, $CeO_2$, and $Ce_2O_3$. These metal oxides may be used alone. Alternatively, these metal oxides may be used in combination of two species or three or more species. Examples of the combination include a combination of $ZrO_2$—$SnO_2$, a combination of $SnO_2$—$SiO_2$, and a combination of $TiO_2$—$SnO_2$—$ZrO_2$.

Preferred examples of the aforementioned inorganic oxide particles include particles of silica, zirconia, and titania, which are used alone or in combination. In particular, the inorganic oxide particles are preferably silica particles.

The aforementioned inorganic oxide particles may be oxide particles having a core-shell structure. The inorganic oxide particles may be, for example, metal oxide particles having a core-shell structure in which the surface of a core particle formed of at least one metal oxide selected from the group consisting of tin oxide, zirconium oxide, and titanium oxide is coated with at least one metal oxide selected from among silica, tin oxide, antimony oxide, and tungsten oxide.

In the aforementioned sol used as a raw material, the inorganic oxide particles may have an average particle diameter of 5 to 200 nm, 5 to 150 nm, or 5 to 100 nm as measured by dynamic light scattering, and the inorganic oxide particles may have an average primary particle diameter of 5 to 200 nm, or 5 to 150 nm, or 5 to 100 nm as measured by observation with a transmission electron microscope.

The sol of the present invention is produced through the following steps (A) to (D).

The step (A) is a step of preparing a sol containing a $C_{4-8}$ alcohol having a carbon chain with a carbon-carbon bond in the molecule in an amount of 15% by mass or more in the entire dispersion medium, from a sol containing, as a dispersoid, inorganic oxide particles having an average particle diameter of 5 to 200 nm as measured by dynamic light scattering, and an aqueous solvent or a $C_{1-3}$ alcohol as a dispersion medium.

The sol containing an aqueous solvent or a $C_{1-3}$ alcohol as a dispersion medium is a sol serving as a starting material.

Examples of the $C_{1-3}$ alcohol include methanol, ethanol, n-propanol, and isopropanol. In particular, the sol is, for example, a silica sol containing methanol as a dispersion medium. The silica sol containing methanol as a dispersion medium is prepared by replacement of the aqueous medium of an acidic aqueous silica sol having a pH of 1 to 6 by methanol. The sol has a solid content of 0.1 to 60% by mass, or 1 to 55% by mass, or 10 to 55% by mass.

The $C_{4-8}$ alcohol having a carbon chain with a carbon-carbon bond in the molecule used in the step (A) can function as a compatibilizing agent. Examples of the alcohol include, but are not limited to, n-butanol, n-pentanol, n-hexanol, and n-octanol. In particular, n-butanol is preferred. In the step (A), the $C_{4-8}$ alcohol having a carbon chain with a carbon-carbon bond in the molecule may be contained in an amount of 15% by mass or more in the entire dispersion medium. The amount of the $C_{4-8}$ alcohol may be adjusted to, for example, 15 to 99% by mass, or 15 to 80% by mass, or 30 to 80% by mass. The amount of the $C_{4-8}$ alcohol may be adjusted to fall within the aforementioned range by adding a $C_{4-8}$ alcohol having a carbon chain with a carbon-carbon bond in the molecule to the sol containing an aqueous solvent or a $C_{1-3}$ alcohol as a dispersion medium, or by removing the aqueous solvent or the $C_{1-3}$ alcohol with, for example, an evaporator after addition of the $C_{4-8}$ alcohol.

The step (B) is a step of adding a silane compound of Formula (1) to the sol prepared in the step (A), and allowing reaction to proceed at a temperature of 20° C. to the boiling point of the dispersion medium (at ambient temperature and pressure) for 0.1 to 6 hours.

In a silane compound of Formula (1), $R^1$ is an alkyl group, a halogenated alkyl group, an alkenyl group, or an organic group having an epoxy group, a (meth)acryloyl group, a mercapto group, an amino group, a ureido group, or a cyano group, and is bonded to a silicon atom via an Si—C bond; at least one $R^1$ is a $C_{4-18}$ alkyl group and is bonded to a silicon atom via an Si—C bond; $R^2$ is an alkoxy group, an acyloxy group, or a halogen group; and a is an integer of 1 to 3.

The aforementioned alkyl group is a $C_{1-18}$ alkyl group. Examples of the alkyl group include, but are not limited to, methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, 2-ethyl-3-methyl-cyclopropyl group, hexyl group, heptyl group, octyl group, nonyl group, decyl group, undecyl group, dodecyl group, tridecyl group, tetradecyl group, pentadecyl group, hexadecyl group, heptadecyl group, and octadecyl group.

The $C_{4-18}$ alkyl group is, for example, a $C_{4-18}$ or $C_{6-18}$ alkyl group among the above-exemplified $C_{1-18}$ alkyl groups. Examples thereof include hexyl group, decyl group, and octadecyl group.

Examples of the alkylene group include alkylene groups derived from any of the aforementioned alkyl groups.

The alkenyl group is a $C_{2-10}$ alkenyl group. Examples of the alkenyl group include, but are not limited to, ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, and 2-methyl-2-pentenyl group.

The aforementioned alkoxy group is, for example, a $C_{1-10}$ alkoxy group. Examples of the alkoxy group include, but are not limited to, methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, and n-hexyloxy group.

The aforementioned acyloxy group is, for example, a $C_{2-10}$ acyloxy group. Examples of the acyloxy group include, but are not limited to, methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, and 2-methyl-n-pentylcarbonyloxy group.

Examples of the aforementioned halogen group include fluorine, chlorine, bromine, and iodine. The aforementioned "(meth)acryloyl group" refers to both an acryloyl group and a methacryloyl group.

Examples of the compound of Formula (1) include those shown below.

Formula (1-1)

Formula (1-2)

Formula (1-3)

In the aforementioned formulae, $R^{11}$ is an alkoxy group, such as a methoxy group or an ethoxy group.

In the step (B), a silane compound of Formula (1) is added to the sol prepared in the step (A) with stirring, and a hydroxyl group on the surfaces of the inorganic oxide particles (e.g., a silanol group in the case of silica particles) is reacted with a hydrolyzable group (e.g., an alkoxy group) of the silane compound of Formula (1), to thereby coat the surfaces of the inorganic oxide particles with the silane compound of Formula (1) via a siloxane bond. The reaction temperature may be a temperature of 20° C. to the boiling point of the dispersion medium used, for example, 20° C. to 100° C. The reaction time may be about 0.1 to 6 hours.

Water is required for hydrolysis of the silane compound of Formula (1). In the case of the sol containing an aqueous solvent, the aqueous solvent can be used. In the case of the sol containing a $C_{1-3}$ alcohol solvent, water remaining in the alcohol solvent can be used. The remaining water corresponds to water remaining after replacement of the aqueous solvent in the sol with the $C_{1-3}$ alcohol solvent. For example, water contained in the aforementioned alcohol in an amount of 1% by mass or less (e.g., 0.01 to 1% by mass) can be used. The hydrolysis may be performed in the presence or absence of a catalyst. Examples of the usable hydrolysis catalyst include a metal chelate compound, an organic acid, an inorganic acid, an organic base, and an inorganic base. Examples of the metal chelate compound serving as a hydrolysis catalyst include triethoxy-mono(acetylacetonato) titanium and triethoxy-mono(acetylacetonato)zirconium. Examples of the organic acid serving as a hydrolysis catalyst include acetic acid and oxalic acid. Examples of the inorganic acid serving as a hydrolysis catalyst include hydrochloric acid, nitric acid, sulfuric acid, hydrofluoric acid, and phosphoric acid. Examples of the organic base serving as a hydrolysis catalyst include pyridine, pyrrole, piperazine, and quaternary ammonium salts. Examples of the inorganic base serving as a hydrolysis catalyst include ammonia, sodium hydroxide, and potassium hydroxide.

The step (C) is a step of adding a hydrocarbon containing a $C_{6-18}$ paraffinic hydrocarbon, a $C_{6-18}$ naphthenic hydrocarbon, or a mixture of these to the sol prepared in the step (B), and removing the alcohol.

The paraffinic hydrocarbon is a saturated hydrocarbon represented by $C_nH_{2n+2}$. The present invention involves the use of a paraffinic hydrocarbon wherein n is 6 to 18. Examples of the hydrocarbon include unbranched n-paraffins (normal paraffins) and branched i-paraffins (isoparaffins). A mixture of these paraffins may be used. Such a hydrocarbon can be produced from petroleum, and may contain a small amount of an olefin generated in a pyrolysis or catalytic cracking process (e.g., an unsaturated bond-containing compound such as limonene or diisobutylene).

Examples of the n-paraffin include, but are not limited to, n-hexane, n-heptane, n-octane, n-nonane, and n-decane.

Examples of the i-paraffin include, but are not limited to, i-octane, i-nonane, and i-decane.

Examples of the naphthenic hydrocarbon include saturated monocyclic naphthenes represented by $C_nH_{2n}$ and alkyl group adducts thereof, and saturated bicyclic naphthenes represented by $C_nH_{2n-2}$ and alkyl group adducts thereof. An aromatic component is almost completely removed from such a naphthenic hydrocarbon. Specifically, the aromatic content of the naphthenic hydrocarbon may be 0.6% by mass or less, or 0.1% by mass or less, or 0.01% by mass or less, or 0.001% by mass or less. The present invention may involve the use of a naphthenic hydrocarbon wherein n is 6 to 18.

Examples of the monocyclic naphthene include, but are not limited to, cycloheptane, methylcyclohexane, ethylcyclohexane, and nonylcyclohexane.

Examples of the bicyclic naphthene include, but are not limited to, decahydronaphthalene.

The solvent containing a $C_{6-18}$ paraffinic hydrocarbon, a $C_{6-18}$ naphthenic hydrocarbon, or a mixture of these is a petroleum hydrocarbon. Examples thereof include trade name Exxsol Hexane, trade name Exxsol Heptane, trade name Exxsol DSP80/100, trade name Exxsol DSP100/140, trade name Exxsol DSP145/160, trade name Exxsol D40, trade name Exxsol D60, trade name Exxsol D80, trade name Exxsol D110, trade name Exxsol D130, and trade name Isoper G, which are available from Exxon Mobil Corporation.

In the step (C), a hydrocarbon containing a $C_{6-18}$ paraffinic hydrocarbon, a $C_{6-18}$ naphthenic hydrocarbon, or a mixture of these is added to the sol prepared in the step (B), and an aqueous solvent or a $C_{1-3}$ alcohol is removed together with a $C_{4-8}$ alcohol having a carbon chain with a carbon-carbon bond in the molecule. In this case, the dispersion medium is a mixed solvent containing (the aqueous solvent or the $C_{1-3}$ alcohol) and (the $C_{4-8}$ alcohol having a carbon chain with a carbon-carbon bond in the molecule) and (the hydrocarbon containing a $C_{6-18}$ paraffinic hydrocarbon, a $C_{6-18}$ naphthenic hydrocarbon, or a mixture of these). For example, the proportions by mass of (the aqueous solvent or the $C_{1-3}$ alcohol):(the $C_{4-8}$ alcohol having a carbon chain with a carbon-carbon bond in the molecule):(the hydrocarbon containing a $C_{6-18}$ paraffinic hydrocarbon, a $C_{6-18}$ naphthenic hydrocarbon, or a mixture of these) may be 1:4 to 10:4 to 10 or 1:5 to 8:5 to 10. The amount of the inorganic oxide particles (e.g., silica particles) dispersed in the mixed dispersion medium is 0.1 to 60% by mass, or 1 to 55% by mass, or 10 to 55% by mass.

In the step (D), at least one silane compound selected from the group consisting of silane compounds of Formulae (2) and (3) is added to the sol prepared in the step (C), and reaction is allowed to proceed at a temperature of 20° C. to the boiling point of the dispersion medium for 0.1 to 6 hours.

In silane compounds of Formulae (2) and (3), $R^3$ and $R^5$ are each a $C_{1-3}$ alkyl group and bonded to a silicon atom via an Si—C bond; $R^4$ and $R^6$ are each an alkoxy group, an acyloxy group, or a halogen group; Y is an alkylene group, an NH group, or an oxygen atom; at least one of $R^3$ and at least one of $R^5$ are a $C_{1-3}$ alkyl group and bonded to a silicon atom via an Si—C bond; b is an integer of 1 to 3; c is an integer of 0 or 1; and d is an integer of 1 to 3.

Each of the compounds of Formulae (2) and (3) is preferably a compound capable of forming a trimethylsilyl group on the surfaces of the inorganic oxide particles.

Examples of the compound include those shown below.

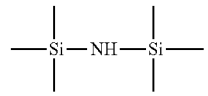

Formula (2-1)

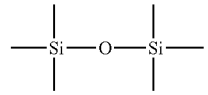

Formula (2-2)

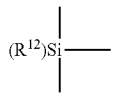

Formula (2-3)

In the aforementioned formulae, $R^{12}$ is an alkoxy group, such as a methoxy group or an ethoxy group.

In the step (D), a hydroxyl group on the surfaces of the inorganic oxide particles (e.g., a silanol group in the case of silica particles) is reacted with the silane compound of Formula (2) or (3), to thereby coat the surfaces of the inorganic oxide particles with the silane compound of Formula (2) or (3) via a siloxane bond. The reaction temperature may be a temperature of 20° C. to the boiling point of the dispersion medium, for example, 20° C. to 100° C. The reaction time may be about 0.1 to 6 hours.

Water is required for hydrolysis of each of the silane compounds of Formulae (2) and (3). In the case of the sol containing an aqueous solvent, the aqueous solvent can be used. In the case of the sol containing a $C_{1-3}$ alcohol solvent, water remaining in the alcohol solvent can be used. The remaining water corresponds to water remaining after replacement of the aqueous solvent in the sol with the $C_{1-3}$ alcohol solvent. For example, water contained in the aforementioned alcohol in an amount of 1% by mass or less (e.g., 0.01 to 1% by mass) can be used.

In the step (B), the aforementioned water is used for hydrolysis of the silane compound of Formula (1). Water is regenerated through reaction (dehydration condensation) between the hydrolyzed silane compound of Formula (1) and an OH group on the surfaces of the inorganic oxide particles. The thus-generated water may be used for hydrolysis of each of the silane compounds of Formulae (2) and (3).

The hydrolysis may be performed in the presence or absence of a catalyst. Examples of the usable hydrolysis catalyst include a metal chelate compound, an organic acid, an inorganic acid, an organic base, and an inorganic base. Examples of the metal chelate compound serving as a hydrolysis catalyst include triethoxy-mono(acetylacetonato)titanium and triethoxy-mono(acetylacetonato)zirconium. Examples of the organic acid serving as a hydrolysis catalyst include acetic acid and oxalic acid. Examples of the inorganic acid serving as a hydrolysis catalyst include hydrochloric acid, nitric acid, sulfuric acid, hydrofluoric acid, and phosphoric acid. Examples of the organic base serving as a hydrolysis catalyst include pyridine, pyrrole, piperazine, and quaternary ammonium salts. Examples of the inorganic base serving as a hydrolysis catalyst include ammonia, sodium hydroxide, and potassium hydroxide.

Preferably, the silane compound of Formula (1) is first reacted with the surfaces of the inorganic oxide particles, and then the silane compound of Formula (2) and/or Formula (3) is reacted with the surfaces of the inorganic oxide particles. Since each of the silane compounds of Formulae (2) and (3) has a relatively low molecular weight, when the silane compound of Formula (2) and/or Formula (3) and the silane compound of Formula (1) are simultaneously reacted with the surfaces of the inorganic oxide particles, the silane compound of Formula (2) and/or Formula (3) may be preferentially bonded to the particle surfaces. Thus, preferably, the silane compound of Formula (1), which has a sterically bulky molecular structure, is previously bonded to the surfaces of the inorganic oxide particles. Consequently, the silane compound of Formula (2) and/or Formula (3) is bonded to the particle surfaces at intervals between molecules of the bonded silane compound of Formula (1), and the resultant inorganic oxide particle surfaces are highly hydrophobized.

The sol containing the inorganic oxide particles (e.g., silica particles) contains a silane compound in which a $C_{4-18}$ alkyl group is bonded to a silicon atom (derived from the silane compound of Formula (1)) and a silane compound in which a $C_{1-3}$ alkyl group is bonded to a silicon atom (derived from the silane compound of Formula (2) and/or Formula (3)) in proportions by mole of 1:0.1 to 30 or 1:0.1 to 20 in terms of silicon atom. The surfaces of the inorganic oxide particles have thereon silane atoms in which a $C_{4-18}$ alkyl group is bonded to a silicon atom (derived from the silane compound of Formula (1)) and silane atoms in which a $C_{1-3}$ alkyl group is bonded to a silicon atom (derived from the silane compound of Formula (2) and/or Formula (3)) in proportions of $1/nm^2$:0.1 to $10/nm^2$.

The present invention may involve the step (E); i.e., a step of removing the aqueous solvent or the $C_{1-3}$ alcohol and the $C_{4-8}$ alcohol having a carbon chain with a carbon-carbon bond in the molecule from the sol, in order to further increase the amount of the hydrocarbon containing a $C_{6-18}$ paraffinic hydrocarbon, a $C_{6-18}$ naphthenic hydrocarbon, or a mixture of these in the dispersion medium of the sol. The removal of the solvents can be performed by a distillation process with an evaporator.

In this case, the proportions by mass of (the aqueous solvent or the Ci-s alcohol): (the $C_{4-8}$ alcohol having a carbon chain with a carbon-carbon bond in the molecule): (the hydrocarbon containing a $C_{6-18}$ paraffinic hydrocarbon, a $C_{6-18}$ naphthenic hydrocarbon, or a mixture of these) in the dispersion medium may be 0 to 1.0:0.1 to 5.0:100. The amount of the inorganic oxide particles (e.g., silica particles) dispersed in the mixed dispersion medium is 0.1 to 60% by mass, or 1 to 55% by mass, or 10 to 55% by mass.

The inorganic oxide sol of the present invention is a hydrophobic sol dispersed in a petroleum solvent, and can be used in, for example, an adhesive, a releasing agent, a semiconductor sealing material, an LED sealing material, a paint, a film internal additive, a hard coating agent, a photoresist material, a printing ink, a detergent, a cleaner, any resin additive, an insulating composition, an antirust, a lubricant, a metal processing oil, a film coating agent, or a peeling agent.

EXAMPLES

Example 1

Step (A): A 1 L three-necked round-bottom flask was charged with 500 g of a silica sol dispersed in methanol (product name: MA-ST-ZL-IP, average primary particle diameter: 85 nm as measured by observation with a transmission electron microscope, silica concentration: 40% by mass, available from Nissan Chemical Corporation), and the solvent was replaced by n-butanol (special grade, available from Kanto Chemical Co., Inc.) with a rotary evaporator, to thereby prepare a silica sol (average primary particle diameter: 85 nm, silica concentration: 40% by mass) dispersed in a mixed solvent of methanol and n-butanol (mixing proportions=4:6).

Step (B): To the silica sol was added 2.52 g of decyltrimethoxysilane (i.e., the aforementioned silane coupling agent) (product name: KBM-3103C, available from Shin-Etsu Chemical Co., Ltd.). The resultant mixture was maintained at 65° C. for three hours with stirring.

Step (C): Subsequently, the solvent was replaced by Exxsol DSP145/160 with a rotary evaporator, to thereby prepare a silica sol (average primary particle diameter: 85 nm, silica concentration: 40% by mass) dispersed in a mixed solvent of methanol, n-butanol, and Exxsol DSP145/160 (mixing proportions=2:13:15).

Step (D): Thereafter, 10.3 g of hexamethyldisilazane as a trimethylsilyl group (product name: SZ-31, available from Shin-Etsu Chemical Co., Ltd.) was added to the silica sol, and the resultant mixture was heated at 65° C. for five hours. The silica sol was found to contain silica particles containing a silicon atom containing a decyl group and a silicon atom containing a methyl group in proportions by mole of 1:13.3 in terms of silicon atom.

Step (E): After completion of the reaction, the silica sol was transferred to a 1 L eggplant-shaped flask, and the solvent was replaced by Exxsol DSP145/160, to thereby produce a silica sol dispersed in Exxsol DSP145/160 (solid content (in terms of $SiO_2$): 50% by mass, average particle diameter as measured by dynamic light scattering: 102 nm, Ostwald viscosity at 20° C. (specific gravity: 0.880, solid content: 20% by mass): 1.06 mPa·s, Ostwald viscosity at 20° C. (specific gravity: 0.958, solid content: 30% by mass): 1.35 mPa·s, Ostwald viscosity at 20° C. (specific gravity: 1.144, solid content: 50% by mass): 2.97 mPa·s, n-butanol content of the dispersion medium: 1.0% by mass, balance: Exxsol DSP145/160).

The Exxsol DSP145/160 solvent was found to have an Ostwald viscosity at 20° C. (specific gravity: 0.760) of 0.81 mPa·s.

The viscosity of the resultant sol was 1.31 times (solid content: 20% by mass), 1.67 times (solid content: 30% by mass), and 3.67 times (solid content: 50% by mass) the viscosity of Exxsol DSP145/160 at 20° C.

Example 2

A silica sol dispersed in Exxsol DSP145/160 was produced in the same manner as in Example 1, except that 2.52 g of decyltrimethoxysilane (silane coupling agent) was replaced by 1.98 g of hexyltrimethoxysilane (product name: KBM-3063, available from Shin-Etsu Chemical Co., Ltd.) in the step (B). The silica sol was found to contain silica particles containing a silicon atom containing a hexyl group and a silicon atom containing a methyl group in proportions by mole of 1:13.3 in terms of silicon atom.

This procedure produced a silica sol dispersed in Exxsol DSP145/160 (solid content (in terms of $SiO_2$): 50% by mass, average particle diameter as measured by dynamic light scattering: 117 nm, Ostwald viscosity at 20° C. (specific gravity: 1.143, solid content: 50% by mass): 6.00 mPa·s, n-butanol content of the dispersion medium: 1.0% by mass, balance: Exxsol DSP145/160).

The Exxsol DSP145/160 solvent was found to have an Ostwald viscosity at 20° C. (specific gravity: 0.760) of 0.81 mPa·s.

The viscosity of the resultant sol was 7.40 times (solid content: 50% by mass) the viscosity of Exxsol DSP145/160 at 20° C.

Example 3

A silica sol dispersed in Exxsol DSP145/160 was produced in the same manner as in Example 1, except that 2.52 g of decyltrimethoxysilane (silane coupling agent) was replaced by 3.60 g of octadecyltrimethoxysilane (available from Tokyo Chemical Industry Co., Ltd.) in the step (B). The silica sol was found to contain silica particles containing a silicon atom containing an octadecyl group and a silicon atom containing a methyl group in proportions by mole of 1:13.3 in terms of silicon atom.

This procedure produced a silica sol dispersed in Exxsol DSP145/160 (solid content (in terms of $SiO_2$): 50% by mass, average particle diameter as measured by dynamic light scattering: 99 nm, Ostwald viscosity at 20° C. (specific gravity: 1.148, solid content: 50% by mass): 3.04 mPa·s, n-butanol content of the dispersion medium: 1.0% by mass, balance: Exxsol DSP145/160).

The Exxsol DSP145/160 solvent was found to have an Ostwald viscosity at 20° C. (specific gravity: 0.760) of 0.81 mPa·s.

The viscosity of the resultant sol was 3.75 times (solid content: 50% by mass) the viscosity of Exxsol DSP145/160 at 20° C.

Example 4

A silica sol dispersed in Exxsol DSP145/160 was produced in the same manner as in Example 1, except that 17.3 g of hexamethyldisilazane (i.e., trimethylsilyl group-containing compound) was replaced by 10.4 g of hexamethyldisiloxane (product name: KF-96L, available from Shin-Etsu Chemical Co., Ltd.) in the step (D). The silica sol was found to contain silica particles containing a silicon atom containing a decyl group and a silicon atom containing a methyl group in proportions by mole of 1:13.3 in terms of silicon atom.

This procedure produced a silica sol dispersed in Exxsol DSP145/160 (solid content (in terms of $SiO_2$): 50% by mass, average particle diameter as measured by dynamic light scattering: 110 nm, Ostwald viscosity at 20° C. (specific gravity: 1.142, solid content: 50% by mass): 2.86 mPa·s, n-butanol content of the dispersion medium: 1.0% by mass, balance: Exxsol DSP145/160).

The Exxsol DSP145/160 solvent was found to have an Ostwald viscosity at 20° C. (specific gravity: 0.760) of 0.81 mPa·s.

The viscosity of the resultant sol was 3.53 times (solid content: 50% by mass) the viscosity of Exxsol DSP145/160 at 20° C.

Example 5

A silica sol dispersed in Exxsol DSP145/160 was produced in the same manner as in Example 1, except that 17.3 g of hexamethyldisilazane (i.e., trimethylsilyl group-containing compound) was replaced by 13.4 g of trimethylmethoxysilane (product name: Z-6013, available from Dow Corning Toray) in the step (D). The silica sol was found to contain silica particles containing a silicon atom containing a decyl group and a silicon atom containing a methyl group in proportions by mole of 1:13.3 in terms of silicon atom.

This procedure produced a silica sol dispersed in Exxsol DSP145/160 (solid content (in terms of $SiO_2$): 50% by mass, average particle diameter as measured by dynamic light scattering: 107 nm, Ostwald viscosity at 20° C. (specific gravity: 1.143, solid content: 50% by mass): 2.86 mPa·s, n-butanol content of the dispersion medium: 1.0% by mass, balance: Exxsol DSP145/160).

The Exxsol DSP145/160 solvent was found to have an Ostwald viscosity at 20° C. (specific gravity: 0.760) of 0.81 mPa·s.

The viscosity of the resultant sol was 3.53 times (solid content: 50% by mass) the viscosity of Exxsol DSP145/160 at 20° C.

Example 6

A silica sol dispersed in Exxsol DSP145/160 was produced in the same manner as in Example 1, except that n-butanol (i.e., compatibilizing agent) was replaced by 1-hexanol (available from Tokyo Chemical Industry Co., Ltd.) in the step (A). The silica sol was found to contain silica particles containing a silicon atom containing a decyl group and a silicon atom containing a methyl group in proportions by mole of 1:13.3 in terms of silicon atom.

This procedure produced a silica sol dispersed in Exxsol DSP145/160 (solid content (in terms of $SiO_2$): 50% by mass, average particle diameter as measured by dynamic light scattering: 101 nm, Ostwald viscosity at 20° C. (specific gravity: 1.141, solid content: 50% by mass): 2.94 mPa·s, 1-hexanol content of the dispersion medium: 1.0% by mass, balance: Exxsol DSP145/160).

The Exxsol DSP145/160 solvent was found to have an Ostwald viscosity at 20° C. (specific gravity: 0.760) of 0.81 mPa·s.

The viscosity of the resultant sol was 3.63 times (solid content: 50% by mass) the viscosity of Exxsol DSP145/160 at 20° C.

Example 7

Step (A): A 500 mL three-necked round-bottom flask was charged with 300 g of a silica sol dispersed in methanol (product name: MT-ST, average primary particle diameter: 12 nm as measured by observation with a transmission electron microscope, silica concentration: 30% by mass, available from Nissan Chemical Corporation), and the solvent was replaced by n-butanol solvent with a rotary evaporator, to thereby prepare a silica sol (average primary particle diameter: 12 nm, silica concentration: 30% by mass) dispersed in a mixed solvent of methanol and n-butanol (mixing proportions=4:6).

Step (B): To the silica sol was added 13.8 g of decyltrimethoxysilane (i.e., the aforementioned silane coupling agent) (product name: KBM-3103C, available from Shin-Etsu Chemical Co., Ltd.). The resultant mixture was maintained at 65° C. for three hours with stirring.

Step (C): Subsequently, the solvent was replaced by Exxsol DSP145/160 with a rotary evaporator, to thereby prepare a silica sol (average primary particle diameter: 12 nm, silica concentration: 30% by mass) dispersed in a mixed solvent of methanol, n-butanol, and Exxsol DSP145/160 (mixing proportions=2:13:15).

Step (D): Thereafter, 56.7 g of hexamethyldisilazane (i.e., trimethylsilyl group-containing compound) (product name: SZ-31, available from Shin-Etsu Chemical Co., Ltd.) was added to the silica sol, and the resultant mixture was heated at 65° C. for five hours. The silica sol was found to contain silica particles containing a silicon atom containing a decyl group and a silicon atom containing a methyl group in proportions by mole of 1:13.3 in terms of silicon atom.

Step (E): After completion of the reaction, the silica sol was transferred to a 500 mL eggplant-shaped flask, and the solvent was replaced by Exxsol DSP145/160, to thereby produce a silica sol dispersed in Exxsol DSP145/160 (solid content (in terms of $SiO_2$): 50% by mass, average particle diameter as measured by dynamic light scattering: 18 nm, Ostwald viscosity at 20° C. (specific gravity: 0.876, solid content: 20% by mass): 1.57 mPa·s, Ostwald viscosity at 20° C. (specific gravity: 0.950, solid content: 30% by mass): 1.69 mPa·s, Ostwald viscosity at 20° C. (specific gravity: 1.131, solid content: 50% by mass): 6.29 mPa·s, n-butanol content of the dispersion medium: 1.0% by mass, balance: Exxsol DSP145/160).

The Exxsol DSP145/160 solvent was found to have an Ostwald viscosity at 20° C. (specific gravity: 0.760) of 0.81 mPa·s.

The viscosity of the resultant sol was 1.94 times (solid content: 20% by mass), 2.09 times (solid content: 30% by mass), and 7.77 times (solid content: 50% by mass) the viscosity of Exxsol DSP145/160 at 20° C.

Example 8

Step (A): A 1 L three-necked round-bottom flask was charged with 500 g of a zirconia sol dispersed in methanol (product name: HZ-400M7, specific surface area: 190 to 200 $m^2/g$, average primary particle diameter: 15 nm as measured by observation with a transmission electron microscope, solid content: 40% by mass, available from Nissan Chemical Corporation), and the solvent was replaced by n-butanol (special grade, available from Kanto Chemical Co., Inc.) with a rotary evaporator, to thereby prepare a zirconia sol (specific surface area: 190 to 200 $m^2/g$, solid content concentration: 40% by mass) dispersed in a mixed solvent of methanol and n-butanol (mixing proportions=4:6).

Step (B): To the zirconia sol was added 26.2 g of decyltrimethoxysilane (i.e., the aforementioned silane coupling agent) (product name: KBM-3103C, available from Shin-Etsu Chemical Co., Ltd.). The resultant mixture was maintained at 65° C. for three hours with stirring.

Step (C): Subsequently, the solvent was replaced by Exxsol DSP145/160 with a rotary evaporator, to thereby prepare a zirconia sol (specific surface area: 190 to 200 $m^2/g$, solid content concentration: 40% by mass) dispersed in a mixed solvent of methanol, n-butanol, and Exxsol DSP145/160 (mixing proportions=1:9:5).

Step (D): Thereafter, 107.3 g of hexamethyldisilazane as a trimethylsilyl group (product name: SZ-31, available from Shin-Etsu Chemical Co., Ltd.) was added to the zirconia sol, and the resultant mixture was heated at 65° C. for five hours. The zirconia sol was found to contain silica particles containing a silicon atom containing a decyl group and a silicon atom containing a methyl group in proportions by mole of 1:13.3 in terms of silicon atom.

Step (E): After completion of the reaction, the zirconia sol was transferred to a 1 L eggplant-shaped flask, and the solvent was replaced by Exxsol DSP145/160, to thereby produce a zirconia sol dispersed in Exxsol DSP145/160.

This procedure produced a zirconia sol dispersed in Exxsol DSP145/160 (solid content (in terms of $ZrO_2$): 30% by mass, average particle diameter as measured by dynamic light scattering: 44 nm, Ostwald viscosity at 20° C. (specific gravity: 1.024, solid content: 30% by mass): 3.06 mPa·s, n-butanol content of the dispersion medium: 1.0% by mass, balance: Exxsol DSP145/160).

The Exxsol DSP145/160 solvent was found to have an Ostwald viscosity at 20° C. (specific gravity: 0.760) of 0.81 mPa·s.

The viscosity of the resultant sol was 3.78 times (solid content: 30% by mass) the viscosity of Exxsol DSP145/160 at 20° C.

Example 9

Step (A): A 1 L three-necked round-bottom flask was charged with 500 g of a silica sol dispersed in methanol (product name: MA-ST-L, average primary particle diameter: 45 nm as measured by observation with a transmission electron microscope, silica concentration: 40% by mass, available from Nissan Chemical Corporation), and the solvent was replaced by n-butanol (special grade, available from Kanto Chemical Co., Inc.) with a rotary evaporator, to thereby prepare a silica sol (average primary particle diameter: 45 nm, silica concentration: 40% by mass) dispersed in a mixed solvent of methanol and n-butanol (mixing proportions=4:6).

Step (B): To the silica sol was added 7.90 g of decyltrimethoxysilane (i.e., the aforementioned silane coupling agent) (product name: KBM-3103C, available from Shin-Etsu Chemical Co., Ltd.). The resultant mixture was maintained at 65° C. for three hours with stirring.

Step (C): Subsequently, the solvent was replaced by Isoper G with a rotary evaporator, to thereby prepare a silica sol (average primary particle diameter: 85 nm, silica concentration: 40% by mass) dispersed in a mixed solvent of methanol, n-butanol, and Isoper G (mixing proportions=2:13:15).

Step (D): Thereafter, 32.4 g of hexamethyldisilazane as a trimethylsilyl group (product name: SZ-31, available from Shin-Etsu Chemical Co., Ltd.) was added to the silica sol, and the resultant mixture was heated at 65° C. for five hours. The silica sol was found to contain silica particles containing a silicon atom containing a decyl group and a silicon atom containing a methyl group in proportions by mole of 1:13.3 in terms of silicon atom.

Step (E): After completion of the reaction, the silica sol was transferred to a 1 L eggplant-shaped flask, and the solvent was replaced by Isoper G, to thereby produce a silica sol dispersed in Isoper G (solid content (in terms of $SiO_2$): 50% by mass, average particle diameter as measured by dynamic light scattering: 58 nm, Ostwald viscosity at 20° C. (specific gravity: 0.866, solid content: 20% by mass): 1.49 mPa·s, Ostwald viscosity at 20° C. (specific gravity: 1.034, solid content: 30% by mass): 2.04 mPa·s, Ostwald viscosity at 20° C. (specific gravity: 1.132, solid content: 50% by mass): 4.08 mPa·s, n-butanol content of the dispersion medium: 1.0% by mass, balance: Isoper G).

The Isoper G solvent was found to have an Ostwald viscosity at 20° C. (specific gravity: 0.743) of 1.12 mPa·s. The viscosity of the resultant sol was 1.33 times (solid content: 20% by mass), 1.82 times (solid content: 30% by mass), and 3.64 times (50% by mass) the viscosity of Isoper G.

Comparative Example 1

Step (A): A 500 mL three-necked round-bottom flask was charged with 300 g of a silica sol dispersed in isopropanol (product name: IPA-ST, average primary particle diameter: 12 nm as measured by observation with a transmission electron microscope, silica concentration: 30% by mass, available from Nissan Chemical Corporation).

Step (B): To the silica sol was added 13.8 g of decyltrimethoxysilane (i.e., the aforementioned silane coupling agent) (product name: KBM-3103C, available from Shin-Etsu Chemical Co., Ltd.). The resultant mixture was maintained at 65° C. for three hours with stirring.

Step (C): Subsequently, the solvent was replaced by Exxsol DSP145/160 with a rotary evaporator, to thereby prepare a silica sol (average primary particle diameter: 12 nm, silica concentration: 30% by mass) dispersed in a mixed solvent of isopropanol and Exxsol DSP145/160 (mixing proportions=3:2).

Step (D): Thereafter, 56.7 g of hexamethyldisilazane as a trimethylsilyl group (product name: SZ-31, available from Shin-Etsu Chemical Co., Ltd.) was added to the silica sol, and the resultant mixture was heated at 65° C. for five hours. The silica sol was found to contain silica particles containing a silicon atom containing a decyl group and a silicon atom containing a methyl group in proportions by mole of 1:13.3 in terms of silicon atom.

Step (E): After completion of the reaction, the silica sol was transferred to a 500 mL eggplant-shaped flask, and the solvent was replaced by Exxsol DSP145/160, to thereby produce a silica sol dispersed in Exxsol DSP145/160.

This procedure produced a silica sol dispersed in Exxsol DSP145/160 (solid content (in terms of $SiO_2$): 50% by mass, average particle diameter as measured by dynamic light scattering: 39 nm, viscosity (measured by a B-type viscometer) at 20° C. (specific gravity: 1.140, solid content: 50% by mass): 41 mPa·s, isopropanol content of the dispersion medium: 1.0% by mass, balance: Exxsol DSP145/160).

The Exxsol DSP145/160 solvent was found to have an Ostwald viscosity at 20° C. (specific gravity: 0.760) of 0.81 mPa·s.

The viscosity of the resultant sol was 50.6 times (solid content: 50% by mass) the viscosity of Exxsol DSP145/160 at 20° C. This physical property was unsatisfactory.

Comparative Example 2

The same procedure as in Example 1 was performed, except that the solvent was not replaced by n-butanol (special grade, available from Kanto Chemical Co., Inc.) in the step (A). In the step (C), difficulty was encountered in replacing the methanol solvent by Exxsol DSP145/160.

Comparative Example 3

The same procedure as in Example 1 was performed, except that decyltrimethoxysilane (product name: KBM-3103C, available from Shin-Etsu Chemical Co., Ltd.) was not added in the step (B).

This procedure produced a silica sol dispersed in Exxsol DSP145/160 (solid content (in terms of $SiO_2$): 50% by mass, average particle diameter as measured by dynamic light scattering: 4,283 nm, viscosity (measured by a B-type viscometer) at 20° C. (specific gravity: 1.14, solid content: 50% by mass): 13,640 mPa·s, n-butanol content of the dispersion medium: 1.0% by mass, balance: Exxsol DSP145/160).

The Exxsol DSP145/160 solvent was found to have an Ostwald viscosity at 20° C. (specific gravity: 0.760) of 0.81 mPa·s.

The viscosity of the resultant sol was 16,840 times (solid content: 50% by mass) the viscosity of Exxsol DSP145/160 at 20° C. This physical property was unsatisfactory.

Comparative Example 4

The same procedure as in Example 1 was performed, except that hexamethyldisilazane (product name: SZ-31, available from Shin-Etsu Chemical Co., Ltd.) was not added in the step (D).

This procedure produced a silica sol dispersed in Exxsol DSP145/160 (solid content (in terms of $SiO_2$): 50% by mass, average particle diameter as measured by dynamic light scattering: 1,469 nm, viscosity (measured by a B-type viscometer) at 20° C. (specific gravity: 1.14, solid content:

50% by mass): 113 mPa·s, n-butanol content of the dispersion medium: 1.0% by mass, balance: Exxsol DSP145/160).

The Exxsol DSP145/160 solvent was found to have an Ostwald viscosity at 20° C. (specific gravity: 0.760) of 0.81 mPa·s.

The viscosity of the resultant sol was 140 times (solid content: 50% by mass) the viscosity of Exxsol DSP145/160 at 20° C. This physical property was unsatisfactory.

The physical properties of the silica sols produced in Examples 1 to 9 and Comparative Examples 1 to 4 are shown below.

TABLE 1

|  | Solid content (%) | Specific gravity | Viscosity | DLS particle diameter (nm) |
|---|---|---|---|---|
| Example 1 | 50 | 1.144 | 3.0 (Ost) | 102 |
| Example 2 | 50 | 1.143 | 6.0 (Ost) | 117 |
| Example 3 | 50 | 1.148 | 3.0 (Ost) | 99 |
| Example 4 | 50 | 1.142 | 2.9 (Ost) | 110 |
| Example 5 | 50 | 1.143 | 2.9 (Ost) | 107 |
| Example 6 | 50 | 1.141 | 2.9 (Ost) | 101 |
| Example 7 | 50 | 1.131 | 6.3 (Ost) | 18 |
| Example 8 | 30 | 1.024 | 3.1 (Ost) | 44 |
| Example 9 | 50 | 1.132 | 4.1 (Ost) | 58 |
| Comparative Example 1 | 50 | 1.140 | 41.0 (B) | 39 |
| Comparative Example 2 | 50 | — | — | — |
| Comparative Example 3 | 50 | — | 13640 (B) | 4283 |
| Comparative Example 4 | 50 | — | 113 (B) | 1469 |

In Table 1, "(Ost)" corresponds to the results of measurement with an Ostwald viscometer, and "(B)" corresponds to the results of measurement with a B-type viscometer. The Ostwald viscosity was measured with a capillary tube (inner diameter ϕ0.75) made of borosilicate glass. The B-type viscosity was measured with VISCOMETER (BM-type) available from Toki Sangyo Co., Ltd. A viscosity of 10 mPa·s or less was measured with an Ostwald viscometer, and a viscosity of more than 10 mPa·s was measured with a B-type rotational viscometer.

In Table 1, "DLS particle diameter" corresponds to the results of particle diameter measurement by dynamic light scattering. The DLS particle diameter was measured with ZETASIZER NANO available from Malvern Panalytical Ltd.

The solid content was measured through the following procedure: a predetermined amount of each of the aforementioned sols was weighed and placed in a crucible made of alumina; the crucible was placed in an electric furnace available from Yamada Denki Co., Ltd. and heated to 1,000° C. and maintained for 30 minutes; and then the crucible was removed from the electric furnace, followed by calculation of the solid content based on the burnt residue. The specific gravity of a silica sol was measured with a standard gravimeter available from AS ONE Corporation.

INDUSTRIAL APPLICABILITY

The inorganic oxide sol of the present invention is a hydrophobic sol dispersed in a petroleum solvent, and can be used in, for example, an adhesive, a releasing agent, a semiconductor sealing material, an LED sealing material, a paint, a film internal additive, a hard coating agent, a photoresist material, a printing ink, a detergent, a cleaner, any resin additive, an insulating composition, an antirust, a lubricant, a metal processing oil, a film coating agent, or a peeling agent.

The invention claimed is:

1. A sol comprising inorganic oxide particles as a dispersoid; and a dispersion medium containing an organic solvent containing a $C_{6-18}$ paraffinic hydrocarbon, a $C_{6-18}$ naphthenic hydrocarbon, or a mixture of these, and a $C_{4-8}$ alcohol having a carbon-carbon bond in the molecule, wherein:
   the alcohol is contained in an amount of 0.1 to 5% by mass in the entire dispersion medium, the inorganic oxide particles have an average particle diameter of 5 to 200 nm as measured by dynamic light scattering, and the inorganic oxide particles contain a silicon atom bonded to a $C_{1-3}$ alkyl group and a silicon atom bonded to a $C_{4-18}$ alkyl group on a surface of the inorganic oxide particles.

2. The sol according to claim 1, wherein the inorganic oxide particles contain a silane compound in which a $C_{4-18}$ alkyl group is bonded to a silicon atom and a silane compound in which a $C_{1-3}$ alkyl group is bonded to a silicon atom in proportions by mole of 1:0.1 to 30 in terms of silicon atom.

3. The sol according to claim 1, wherein the paraffinic hydrocarbon is a normal paraffinic hydrocarbon or an isoparaffinic hydrocarbon.

4. The sol according to claim 1, wherein the naphthenic hydrocarbon is a saturated aliphatic cyclic hydrocarbon substitutable with a $C_{1-10}$ alkyl group.

5. The sol according to claim 1, wherein the alcohol is n-butanol, n-pentanol, or n-hexanol.

6. The sol according to claim 1, wherein the inorganic oxide particles are particles of an oxide of at least one metal selected from the group consisting of Si, Ti, Fe, Cu, Zn, Y, Zr, Nb, Mo, In, Sn, Sb, Ta, W, Pb, Bi, and Ce.

7. The sol according to claim 6, wherein the inorganic oxide particles are silica particles, zirconia particles, or titania particles.

8. The sol according to claim 6, wherein the inorganic oxide particles are metal oxide particles having a core-shell structure in which the surface of a core particle formed of at least one metal oxide selected from the group consisting of tin oxide, zirconium oxide, and titanium oxide is coated with at least one selected from among silica, tin oxide, antimony oxide, and tungsten oxide.

9. The sol according to claim 1, wherein the inorganic oxide particles are coated with a silane compound of the following

$R^1{}_a Si(R^2)_{4-a}$    Formula (1)

wherein $R^1$ is an alkyl group, a halogenated alkyl group, an alkenyl group, or an organic group having an epoxy group, a (meth)acryloyl group, a mercapto group, an amino group, a ureido group, or a cyano group, and is bonded to a silicon atom via an Si—C bond; at least one R is a $C_{4-18}$ alkyl group and is bonded to a silicon atom via an Si—C bond; $R^2$ is an alkoxy B group, an acyloxy group, or a halogen group; and a is an integer of 1 to 3.

10. The sol according to claim 9, wherein the inorganic oxide particles are coated with at least one silane compound selected from the group consisting of silane compounds of Formula (1) and the following Formulae (2) and (3):

$[R^3{}_b Si(R^4)_{3-b}]_2 Y_c$    Formula (2)

$R^5{}_d Si(R^6)_{4-d}$    Formula (3)

wherein $R^3$ and $R^5$ are each a $C_{1-3}$ alkyl group and bonded to a silicon atom via an Si—C bond; $R^4$ and $R^6$ are each an alkoxy group, an acyloxy group, or a halogen group; Y is an alkylene group, an NH group, or an oxygen atom; at least one $R^3$ and at least one $R^5$ are a $C_{1-3}$ alkyl group and bonded to a silicon atom via an Si—C bond; b is an integer of 1 to 3; c is an B integer of 0 or 1; and d is an integer of 1 to 3.

11. The sol according to claim 1, wherein, when the concentration of the inorganic oxide particles is 50% by mass or less, the viscosity at 20° C. of the sol is 1.0 to 10.0 times the viscosity at 20° C. of the organic solvent containing the $C_{6-18}$ paraffinic hydrocarbon, the $C_{6-18}$ naphthenic hydrocarbon, or a mixture of these, which serves as the dispersion medium.

12. The sol according to claim 11, wherein, when the concentration of the inorganic oxide particles is 5 to 50% by mass, the viscosity at 20° C. of the sol is 1.0 to 10.0 times the viscosity at 20° C. of the organic solvent containing the $C_{6-18}$ paraffinic hydrocarbon, the $C_{6-18}$ naphthenic hydrocarbon, or a mixture of these, which serves as the dispersion medium.

13. A production method for the sol according to claim 9, the method comprising the following steps (A) to (D):
- step (A): a step of preparing a sol containing a $C_{4-8}$ alcohol having a carbon-carbon bond in the molecule in an amount of 15% by mass or more in the entire dispersion medium, from a sol containing, as a dispersoid, inorganic oxide particles having an average particle diameter of 5 to 200 nm as measured by dynamic light scattering, and an aqueous solvent or a $C_{1-3}$ alcohol as a dispersion medium;
- step (B): a step of adding a silane compound of the following Formula (1) to the sol prepared in the step (A), and allowing reaction to proceed at a temperature of 20° C. to the boiling point of the dispersion medium for 0.1 to 6 hours;
- step (C): a step of adding a $C_{6-18}$ paraffinic hydrocarbon, a $C_{6-18}$ naphthenic hydrocarbon, or a mixture of these to the sol prepared in the step (B), and removing water and/or the alcohol to the outside of the system; and
- step (D): a step of adding at least one silane compound selected from the group consisting of silane compounds of the following Formulae (2) and (3) to the sol prepared in the step (C) if necessary, and allowing reaction to proceed at a temperature of 20° C. to the boiling point of the dispersion medium for 0.1 to 6 hours:

$$R^1_a Si(R^2)_{4-a} \quad \text{Formula (1)}$$

$$[R^3_b Si(R^4)_{3-b}]_2 Y_c \quad \text{Formula (2)}$$

$$R^5_d Si(R^6)_{4-d} \quad \text{Formula (3)}$$

in Formula (1), R is an alkyl group, a halogenated alkyl group, an alkenyl group, or an organic group having an epoxy group, a (meth)acryloyl group, a mercapto group, an amino group, a ureido group, or a cyano group, and is bonded to a silicon atom via an Si—C bond; at least one R is a $C_{4-18}$ alkyl group and is bonded to a silicon atom via an Si—C bond; $R^2$ is an alkoxy group, an acyloxy group, or a halogen group; and a is an integer of 1 to 3; and, in Formulae (2) and (3), $R^3$ and $R^5$ are each a $C_{1-3}$ alkyl group and bonded to a silicon atom via an Si—C bond; $R^4$ and $R^6$ are each an alkoxy group, an acyloxy group, or a halogen group; Y is an alkylene group, an NH group, or an oxygen atom; at least one $R^3$ and at least one $R^5$ are a $C_{1-3}$ alkyl group and bonded to a silicon atom via an Si—C bond; b is an integer of 1 to 3; c is B an integer of 0 or 1; and d is an integer of 1 to 3.

14. The production method according to claim 13, wherein the method further comprises the following step (E) after the step (D):
- step (E): a step of adding a $C_{8-18}$ paraffinic hydrocarbon, a $C_{8-18}$ naphthenic hydrocarbon, or a mixture of these, and removing the alcohol.

* * * * *